United States Patent
Wang et al.

(10) Patent No.: US 6,424,039 B2
(45) Date of Patent: *Jul. 23, 2002

(54) DUAL DAMASCENE PROCESS USING SACRIFICIAL SPIN-ON MATERIALS

(75) Inventors: Fei Wang, San Jose; Bhanwar Singh, Morgan Hill; James K. Kai, San Francisco, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/532,731

(22) Filed: Mar. 22, 2000

Related U.S. Application Data

(62) Division of application No. 08/992,537, filed on Dec. 17, 1997, now Pat. No. 6,057,239.

(51) Int. Cl.[7] .............................................. H01L 23/48
(52) U.S. Cl. ...................... 257/750; 257/758; 257/759; 257/760; 257/774
(58) Field of Search ................................ 438/706, 710, 438/712, 637, 638, 639; 257/750, 760, 774, 758, 759

(56) References Cited

U.S. PATENT DOCUMENTS

| | | | |
|---|---|---|---|
| 4,775,550 A | 10/1988 | Chu et al. ...................... 426/38 |
| 5,066,615 A | 11/1991 | Brady et al. ................. 437/195 |
| 5,100,503 A | 3/1992 | Allman et al. .............. 156/643 |
| 5,110,697 A | 5/1992 | Lame, III et al. ............. 430/14 |
| 5,219,788 A | 6/1993 | Abernathey et al. ........ 437/187 |
| 5,264,076 A | * 11/1993 | Cuthbert et al. ............ 156/657 |
| 5,275,972 A | 1/1994 | Ogawa et al. ............... 437/195 |
| 5,401,613 A | 3/1995 | Brewer et al. .............. 430/323 |
| 5,539,080 A | * 7/1996 | Hogan et al. ................ 528/353 |
| 5,573,634 A | 11/1996 | Ham ..................... 156/659.11 |
| 5,635,423 A | 6/1997 | Huang et al. ................ 437/195 |
| 5,705,430 A | * 1/1998 | Avanzino et al. ........... 438/618 |
| 5,741,626 A | * 4/1998 | Jain et al. .................... 430/314 |
| 5,759,911 A | * 6/1998 | Cronin et al. ............... 438/622 |
| 5,910,018 A | * 6/1999 | Jang ........................... 438/425 |
| 6,074,959 A | * 6/2000 | Wang et al. ................. 438/738 |

OTHER PUBLICATIONS

Licata et al., "Dual Damascene Al Wiring For 256M Dram" VMIC Conference pp. 596–602 (1995).

* cited by examiner

*Primary Examiner*—Benjamin L. Utech
*Assistant Examiner*—Lan Vinh
(74) *Attorney, Agent, or Firm*—Foley & Lardner

(57) ABSTRACT

A dual damascene process includes the steps of forming a contact hole in an oxide layer disposed above a semiconductor substrate, disposing a layer of anti-reflective coating material on top of the oxide layer and in the contact hole, and partially etching the layer of anti-reflective coating material and the oxide layer to form the wiring trough. The partial etching step includes the steps of spin coating photoresist on top of the anti-reflective coating material, exposing the photoresist through a mask containing a pattern of the wiring trough, developing the photoresist to expose portions of the anti-reflective coating material, dry etching the exposed portions of the anti-reflective coating material to expose portions of the oxide layer, and wet etching the exposed portions of the oxide layer to form the wiring trough.

6 Claims, 3 Drawing Sheets

DUAL DAMASCENE PROCESS USING SACRIFICIAL SPIN-ON MATERIALS

This application is a divisional application of U.S. Ser. No. 08/992,537, filed Dec. 17, 1997, now U.S. Pat. No. 6,057,239.

BACKGROUND OF THE INVENTION

1. Field of the Invention

The invention relates generally to a dual damascene process for forming a contact hole for an integrated circuit (IC) and more particularly to a dual damascene process that uses a sacrificial layer of spin-on material for protecting the contact hole profile during the damascene etch process.

2. Description of the Related Art

A conventional dual damascene process is described in Licata et al., "Dual Damascene Al Wiring for 256M DRAM," Proceedings of the 12th International VLSI Multilevel Interconection Conference, edited by T. E. Wade (VMIC, Tampa), pp. 596–602 (1995). FIGS. 1A–1F illustrate the steps of the conventional dual damascene process.

FIG. 1A illustrates an oxide layer 20 disposed on top of a semiconductor substrate 10. A layer of photoresist 30 is spin coated on top of the oxide layer 20, exposed through a mask (not shown) containing a contact hole pattern, and developed. An etch opening 31 is thus formed. Using the remaining photoresist as an etch mask, the oxide layer 20 is then etched to form a contact hole 32 and the remaining photoresist is then removed producing the structure shown in FIG. 1B.

Next, a layer of photoresist 33 is applied a second time (FIG. 1C). The photoresist 33 is then exposed through a mask (not shown) and developed to form an etch opening 34 (FIG. 1D). Using the remaining photoresist as an etch mask, the oxide layer 20 is etched to form a wiring trough 35 as shown in FIG. 1E. This etch step is known as a damascene etch step. The remaining photoresist is removed and the contact hole 32 and the wiring trough 35 are filled with metal 36.

The above-described process is difficult to control for three reasons.

First, the reflectivity from the topography substrate makes the width of the etch opening 34 in the photoresist 33 difficult to control.

Second, as feature sizes have become smaller, the aspect ratio (height/width) of the contact hole 32 has increased. At high aspect ratios, it is difficult for the photoresist 33 to completely flow into and fill the contact hole 32. If the contact hole is not completely filled, there is a possibility that the photoresist 33 disposed within the contact hole 32 may partially or even completely develop away and provide little or no protection for the contact hole profile during the subsequent damascene etch step.

Third, the thickness of the photoresist 33 over the topography substrate varies signficantly, and so the exposure depth of the photoresist 33 is difficult to control. This is likely to cause an over-development of the photoresist 33 disposed within the contact hole 32 and possibly erode the contact hole profile during the subsequent damascene etch step.

SUMMARY OF THE INVENTION

An object of this invention is to provide a dual damascene process that produces more consistent results by employing an improved process control.

Another object of this invention is to provide a dual damascene process for forming a semiconductor structure with improved damascene etch profiles.

Still another object of this invention is to provide for use in a dual damascene process a semiconductor structure having a sacrificial layer of anti-reflective coating material.

The above and other objects of the invention are accomplished by a dual damascene process including the steps of forming a contact hole in an oxide layer disposed above a semiconductor substrate, disposing a layer of anti-reflective coating material on top of the oxide layer and in the contact hole, and partially etching the layer of anti-reflective coating material and the oxide layer to form the wiring trough.

The partial etching step includes the steps of spin coating photoresist on top of the anti-reflective coating material, exposing the photoresist through a mask containing a pattern of the wiring trough, developing the photoresist to expose portions of the anti-reflective coating material, dry etching the exposed portions of the anti-reflective coating material to expose portions of the oxide layer, and wet etching the exposed portions of the oxide layer to form the wiring trough. The anti-reflective coating material can be non-photosensitive, and is termed a "sacrificial layer" because it is added and then "sacrificed" (i.e., removed) for the, purpose of performing an interim function in the dual damascene process.

The dual damascene process according to the invention employs a semiconductor structure including a substrate, an oxide layer disposed above the substrate, and a layer of anti-reflective coating material disposed on top of the oxide layer. The oxide layer has a contact hole which is filled by the anti-reflective coating material when the anti-reflective coating material is disposed on top of the oxide layer. A photoresist formed to have a wiring trough pattern is disposed on top of the layer of the anti-reflective coating material. The wiring trough pattern defines an opening which is aligned with the contact hole and which has a width larger than that of the contact hole. The photoresist is used as a mask during the damascene etching step that forms the wiring trough in the oxide layer in alignment with the contact hole.

Additional objects, features and advantages of the invention will be set forth in the description of preferred embodiments which follows.

BRIEF DESCRIPTION OF THE DRAWINGS

The invention is described in detail herein with reference to the drawings in which.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENT

Figure 1A:
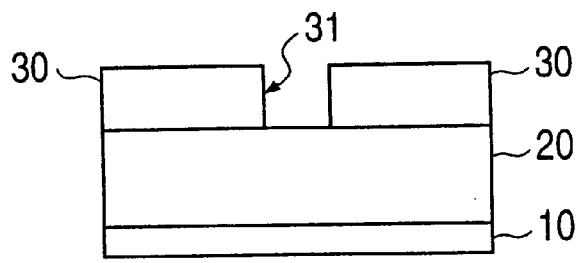
FIGS. 1A–1F illustrate a conventional dual damascene process.
Figure 1B:
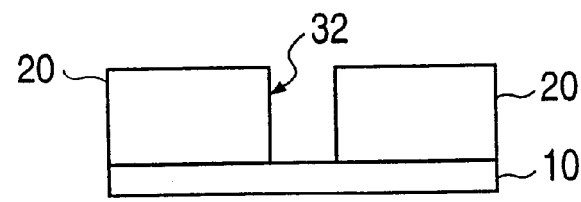
Figure 1C:
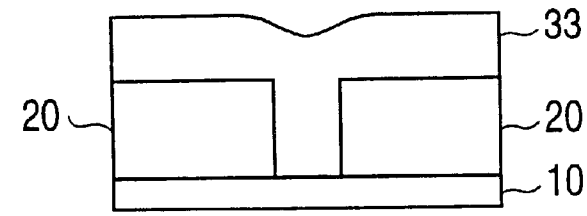
Figure 1D:
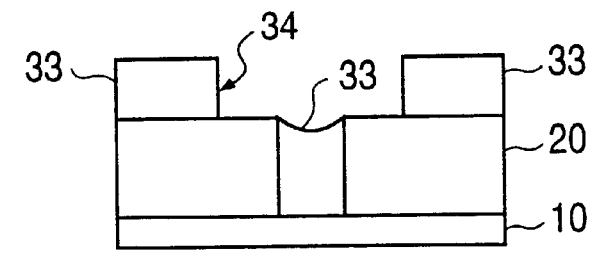
Figure 1E:
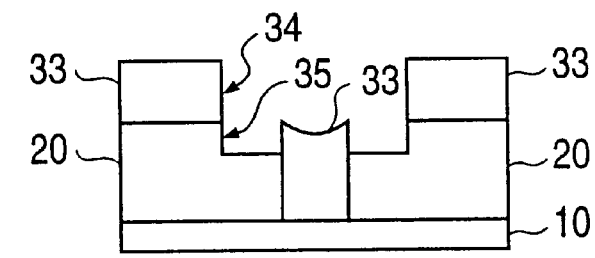
Figure 1F:
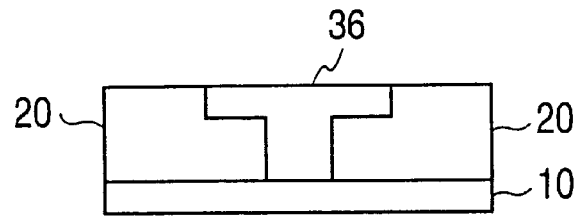
Figure 2A:
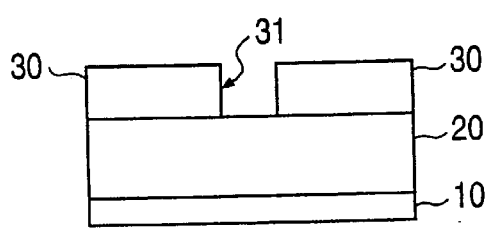
FIGS. 2A–2H illustrate a dual damascene process according to a first embodiment of the invention.
Figure 2B:
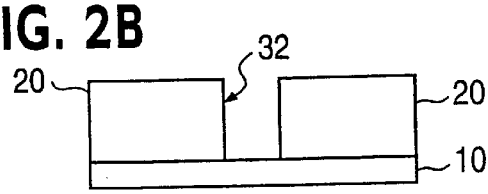

FIGS. 2A–2H illustrate a dual damascene process according to a first embodiment of the invention. FIG. 2A illustrates an oxide layer 20 disposed on top of a semiconductor substrate 10. A layer of photoresist 30 is spin coated on top of the oxide layer 20, exposed through a mask (not shown) containing a contact hole pattern, and developed in a weak alkaline medium to remove the exposed photoresist. An etch opening 31 is thus formed. Using the remaining photoresist as an etch mask, the oxide layer 20 is then wet etched to form a contact hole 32 and the remaining photoresist is removed (FIG. 2B). The wet etch may be either a buffered-oxide etch (BOE) dip or a hydrofluoric (HF) dip.

Figure 2C:
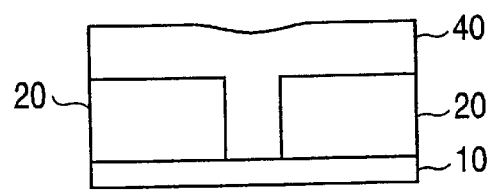
Figure 2D:
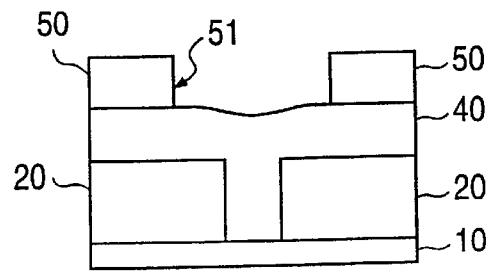

Next, a sacrificial layer 40 of spin-on material is applied on top of the oxide layer 20 (FIG. 2C). The spin-on material is an anti-reflective coating material and can be any of the following: CD11, BARLi, or low dielectric constant materials such as BCB, HSQ, SOG, and Flare. CD11 is preferred when employing deep ultraviolet wavelength photolithography and BARLi is preferred when employing i-line wavelength photolithography. A layer of photoresist 50 is then spin coated on top of the sacrificial layer 40, exposed through a mask (not shown) containing a wiring trough pattern, and developed in a weak alkaline medium to remove the exposed photoresist. An etch opening 51 is thus formed.

Figure 2E:
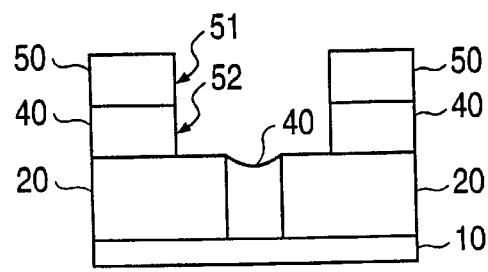
Figure 2F:
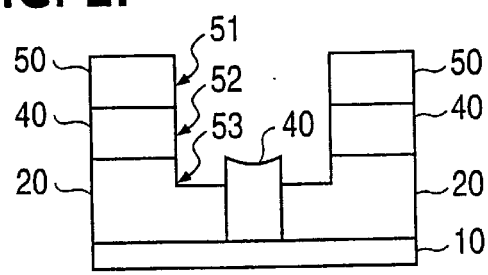

Afterwards, using the remaining photoresist as an etch mask, the sacrificial layer 40 is anisotropically etched to form an opening 52 (FIG. 2E). The anisotropic etch process may be carried out as a dry etch, preferably a plasma etch. Then, using the remaining photoresist and the remaining sacrificial layer as an etch mask, the oxide layer 20 is etched in BOE or HF solution to form a wiring trough 53 as shown in FIG. 2F. When HSQ or SOG is used as the sacrificial layer 40, the sacrificial layer etch step and the oxide etch step can be carried out at the same time using a dry etch, preferably a plasma etch.

Figure 2G:
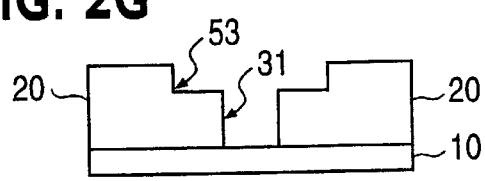
Figure 2H:
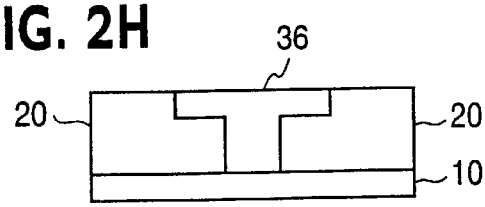

The remaining photoresist and the remaining sacrificial layer are then removed (FIG. 2G). When HSQ (or SOG) is used as the sacrificial layer 40, BOE or HF solution can be used to remove the HSQ (or SOG) layer after the photoresist 50 is stripped because the HSQ (or SOG) etch rate in BOE or HF solution is much faster than that of oxide. Metal 36 is deposited on top of the oxide layer 20 to fill the contact hole 32 and the wiring trough 53, and polished to obtain the structure shown in FIG. 2H. The metal 36 may be tungsten, copper, aluminum, or any alloy thereof.

Figure 3A:
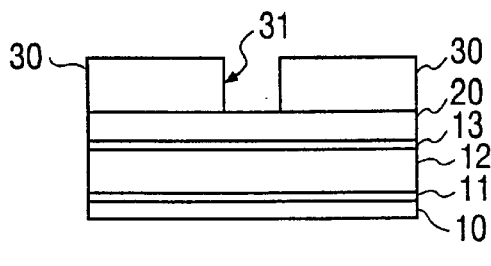
FIGS. 3A–3H illustrate a dual damascene process according to a second embodiment of the invention.
Figure 3E:
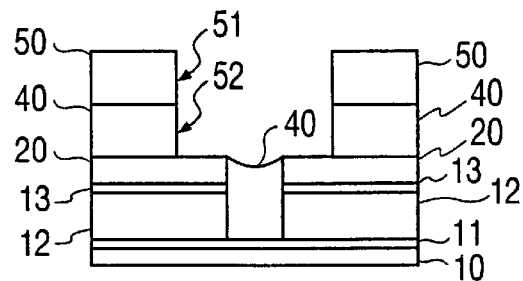
Figure 3B:
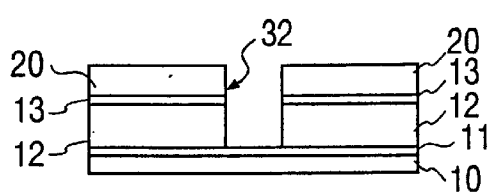

FIGS. 3A–3H illustrate a dual damascene process according to a second embodiment of the invention. FIG. 3A illustrates a first oxide layer 20 disposed on top of a first nitride layer 13, a second oxide layer 12, a second nitride layer 11, and a semiconductor substrate 10. A layer of photoresist 30 is spin coated on top of the oxide layer 20, exposed through a mask (not shown) containing a contact hole pattern, and developed in a weak alkaline medium to remove the exposed photoresist. An etch opening 31 is thus formed. Using the remaining photoresist as an etch mask, the oxide layer 20, the first nitride layer 13, and the second oxide layer 12 are then plasma etched to form a contact hole 32. The remaining photoresist is then removed (FIG. 3B).

Figure 3F:
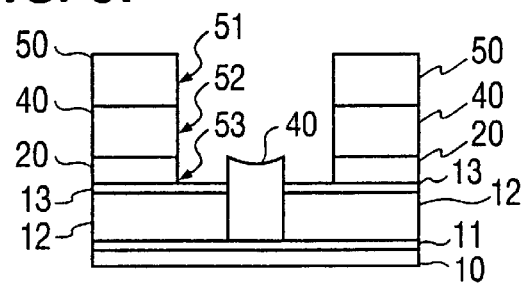
Figure 3C:
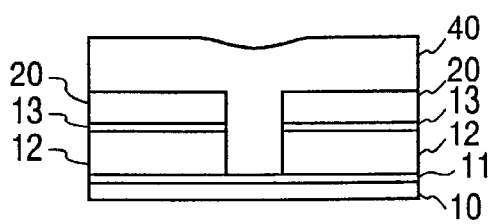

Next, a sacrificial layer 40 of spin-on material is applied on top of the oxide layer 20 (FIG. 3C). The spin-on material is an anti-reflective coating material and can be any of the following: CD11, BARLi, or low dielectric constant materials such as BCB, HSQ, SOG, and Flare. CD11 is preferred when employing deep ultraviolet wavelength photolithography and BARLi is preferred when employing i-line wavelength photolithography. A layer of photoresist 50 is then spin coated on top of the sacrificial layer 40, exposed through a mask (not shown) containing a wiring trough pattern, and developed in a weak alkaline medium to remove the exposed photoresist. An etch opening 51 is thus formed.

Afterwards, using the remaining photoresist as an etch mask, the sacrificial layer 40 is anisotropically etched to form an opening 52 (FIG. 3E). The anisotropic etch process may be carried out as a dry etch, preferably plasma etch. Then, using the remaining photoresist and the remaining sacrificial layer as an etch mask, the oxide layer 20 is plasma etched to form a wiring trough 53 as shown in FIG. 3F. The nitride layer 13 functions well as an etch stop for this etching step. When HSQ (or SOG) is used as the sacrificial layer 40, the sacrificial layer etch step and the oxide etch step can be carried out at the same time using a dry etch, preferably a plasma etch.

Figure 3G:
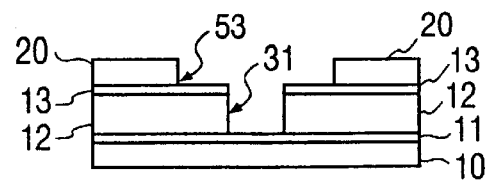
Figure 3D:
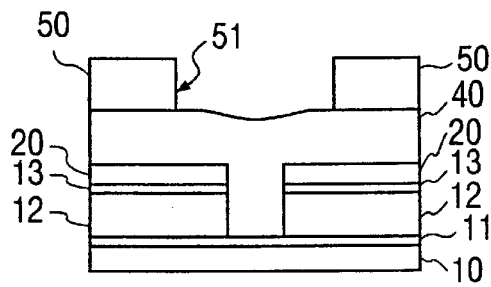
Figure 3H:
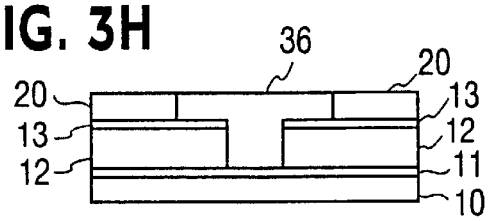

The remaining photoresist and the remaining sacrificial layer are then removed in oxygen plasma (FIG. 3G). When HSQ (or SOG) is used as the sacrificial layer 40, BOE or HF solution can be used to remove the HSQ (or SOG) layer after the photoresist 50 is stripped because the HSQ (or SOG) etch rate in BOE or HF solution is much faster than that of either nitride or oxide. Metal 36 is deposited on top of the oxide layer 20 to fill the contact hole 32 and the wiring trough 35, and polished to obtain the structure shown in FIG. 3H. The metal 36 may be tungsten, copper, aluminum, or any alloy thereof.

While particular embodiments according to the invention have been illustrated and described above, it will be clear that the invention can take a variety of forms and embodiments within the scope of the appended claims.

We claim:

1. A semiconductor structure comprising:

a substrate;

a first nitride layer disposed above and in contact with said substrate;

a first oxide layer disposed above and in contact with said first nitride layer;

a second nitride layer disposed above and in contact with first oxide layer;

a second oxide layer disposed above and in contact with said second nitride layer;

said first and second nitride layers and said first and second oxide layers having a contact hole therein; and a layer of anti-reflective coating material disposed above and in contact with the second oxide layer and filling the contact hole.

2. The semiconductor structure as recited in claim 1, wherein the anti-reflective coating material includes a non-photosensitive material.

3. The semiconductor structure as recited in claim 1, further comprising a photoresist disposed on top of the layer of anti-reflective coating material, the photoresist having a wiring trough pattern.

4. The semiconductor structure as recited in claim 3, wherein the wiring trough pattern defines an opening aligned with the contact hole.

5. The semiconductor structure as recited in claim 4, wherein the width of the opening is larger than the width of the contact hole.

6. The semiconductor structure as recited in claim 4, wherein the widths of the opening and the wiring trough are substantially equal to each other and larger than the width of the contact hole.

* * * * *